United States Patent
Moore et al.

(10) Patent No.: US 6,818,481 B2
(45) Date of Patent: *Nov. 16, 2004

(54) METHOD TO MANUFACTURE A BURIED ELECTRODE PCRAM CELL

(75) Inventors: John T. Moore, Boise, ID (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/803,176

(22) Filed: Mar. 7, 2001

(65) Prior Publication Data

US 2002/0127886 A1 Sep. 12, 2002

(51) Int. Cl.[7] .............................................. H07L 21/82
(52) U.S. Cl. ........................ 438/130; 438/95; 438/768; 438/800
(58) Field of Search .......................... 438/95, 130, 758, 438/761, 768, 800

(56) References Cited

U.S. PATENT DOCUMENTS

| | | |
|---|---|---|
| 3,622,319 A | 11/1971 | Sharp |
| 3,743,847 A | 7/1973 | Boland |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,671,618 A | 6/1987 | Wu et al. |
| 4,795,657 A | 1/1989 | Formigoni et al. |
| 4,800,526 A | 1/1989 | Lewis |
| 4,847,674 A | 7/1989 | Sliwa et al. |
| 5,177,567 A | 1/1993 | Klersy et al. |
| 5,219,788 A | 6/1993 | Abernathey et al. |
| 5,233,217 A | 8/1993 | Dixit et al. ................. 257/530 |

(List continued on next page.)

FOREIGN PATENT DOCUMENTS

| | | |
|---|---|---|
| JP | 56126916 | 10/1981 |
| JP | 2001-266753 A | 3/2001 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Abdel–All, A.; Elshafie,A.; Elhawary, M.M., DC electric–field effect in bulk and thin–film Ge5As38Te57 chalcogenide glass, Vacuum 59 (2000) 845–853.

(List continued on next page.)

*Primary Examiner*—Kamand Cuneo
*Assistant Examiner*—Lisa Kilday
(74) *Attorney, Agent, or Firm*—Dickstein Shapiro Morin & Oshinsky LLP (57) ABSTRACT

An exemplary embodiment of the present invention includes a method for forming a programmable cell by forming an opening in a dielectric material to expose a portion of an underlying first conductive electrode, forming a recessed chalcogenide-metal ion material in said opening and forming a second conductive electrode overlying the dielectric material and the chalcogenide-metal ion material. A method for forming the recessed chalcogenide-metal ion material comprises forming a metal material being recessed approximately 10–90%, in the opening in the dielectric material, forming a glass material on the metal material within the opening and diffusing metal ions from the metal material into the glass material by using ultraviolet light or ultraviolet light in combination with a heat treatment, to cause a resultant metal ion concentration in the glass material.

24 Claims, 2 Drawing Sheets

U.S. PATENT DOCUMENTS

| | | | |
|---|---|---|---|
| 5,238,862 A | 8/1993 | Blalock et al. | |
| 5,272,359 A | 12/1993 | Nagasubramanian et al. | |
| 5,314,772 A | 5/1994 | Kozicki et al. | |
| 5,315,131 A | 5/1994 | Kishimoto et al. | |
| 5,350,484 A | 9/1994 | Gardner et al. | |
| 5,360,981 A | 11/1994 | Owen et al. | |
| 5,500,532 A | 3/1996 | Kozicki et al. | |
| 5,512,328 A | 4/1996 | Yoshimura et al. | |
| 5,512,773 A | 4/1996 | Wolf et al. | |
| 5,726,083 A | 3/1998 | Takaishi | |
| 5,751,012 A | 5/1998 | Wolstenholme et al. | |
| 5,761,115 A | 6/1998 | Kozicki et al. | 365/182 |
| 5,789,277 A | 8/1998 | Zahorik et al. | |
| 5,841,150 A | 11/1998 | Gonzalez et al. | |
| 5,846,889 A | 12/1998 | Harbison et al. | |
| 5,896,312 A | 4/1999 | Kozicki et al. | 365/153 |
| 5,914,893 A | 6/1999 | Kozicki et al. | 365/107 |
| 5,920,788 A | 7/1999 | Reinberg | |
| 5,962,815 A | 10/1999 | Lan et al. | 174/262 |
| 5,998,066 A | 12/1999 | Block et al. | |
| 6,072,716 A | 6/2000 | Jacobson et al. | |
| 6,077,729 A | 6/2000 | Harshfield | |
| 6,084,796 A | 7/2000 | Kozicki et al. | 365/153 |
| 6,117,720 A | 9/2000 | Harshfield | |
| 6,143,604 A | 11/2000 | Chiang et al. | |
| 6,177,338 B1 | 1/2001 | Liaw et al. | |
| 6,236,059 B1 | 5/2001 | Wolstenholme et al. | |
| 6,297,170 B1 | 10/2001 | Gabriel et al. | |
| 6,300,684 B1 | 10/2001 | Gonzalez et al. | |
| 6,316,784 B1 | 11/2001 | Zahorik et al. | |
| 6,329,606 B1 | 12/2001 | Freyman et al. | |
| 6,348,365 B1 * | 2/2002 | Moore et al. | 438/130 |
| 6,350,679 B1 | 2/2002 | McDaniel et al. | |
| 6,376,284 B1 | 4/2002 | Gonzalez et al. | |
| 6,388,324 B2 | 5/2002 | Kozicki et al. | |
| 6,391,688 B1 | 5/2002 | Gonzalez et al. | |
| 6,414,376 B1 | 7/2002 | Thakur et al. | |
| 6,418,049 B1 | 7/2002 | Kozicki et al. | |
| 6,423,628 B1 | 7/2002 | Li et al. | |
| 6,469,364 B1 | 10/2002 | Kozicki | |
| 6,473,332 B1 | 10/2002 | Ignatiev et al. | |
| 6,487,106 B1 | 11/2002 | Kozicki | |
| 2002/0000666 A1 | 1/2002 | Kozicki et al. | |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0127886 A1 | 9/2002 | Moore et al. | |
| 2002/0163828 A1 | 11/2002 | Krieger et al. | |
| 2002/0168820 A1 | 11/2002 | Kozincki et al. | |
| 2002/0190350 A1 | 12/2002 | Kozicki | |
| 2003/0001229 A1 | 1/2003 | Moore et al. | |
| 2003/0027416 A1 | 2/2003 | Moore | |
| 2003/0035314 A1 | 2/2003 | Kozicki | |
| 2003/0035315 A1 | 2/2003 | Kozicki | |

OTHER PUBLICATIONS

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P., Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L., Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X. ;Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cyst. Solids 298 (2002) 260–269.

Guin, J.–P.; Rouxel, T.; Sangleboeuf, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal-a-Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1-x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo-enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259–269.

Kluge, G.; Thomas, A.; Klabes, R.; Grotzschel, R., Silver photodiffusion in amorphous GexSe100-x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin, R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1-x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185–C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K-.;Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a –Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x an AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.,Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature Tg, with average coordination number, $<m>$, in network glasses: evidence of a threshold behavior in the slope $|dTg/d<m>|$ at the rigidity percolation threshold ($<m>=2.4$), J. Non–Cryst. Solids 151 (1992) 149–154.

"Programmable metalization cell technology description" disclosure by Michael Kozicki, Feb. 18, 2000.

Disclosure of inventions M1–006–011, Axon Technologies Corporation, Vic Lyn, Sep. 5, 2000.

Disclosure and record of invention form for M1–008, Arizona State University, Aug. 2000.

* cited by examiner

METHOD TO MANUFACTURE A BURIED ELECTRODE PCRAM CELL

FIELD OF THE INVENTION

This invention relates to semiconductor fabrication processing and more particularly, to methods for forming programmable capacitor dynamic random access memories (PCRAMs) utilizing a programmable metallization cell.

BACKGROUND OF THE INVENTION

Memory devices are used in electronic systems and computers to store information in the form of binary data. These memory devices may be characterized as either volatile memory, where the stored data is lost if the power source is disconnected or removed or non-volatile, where the stored data is retained even during power interruption. An example of a non-volatile memory device is the programmable conductor random access memory (PCRAM) that utilizes a programmable metallization cell (PMC).

A PMC comprises a fast ion conductor such as a chalcogenide-metal ion and at least two electrodes (e.g., an anode and a cathode) comprising an electrically conducting material and disposed at the surface of the fast ion conductor a set distance apart from each other. When a voltage is applied to the anode and the cathode, a non-volatile metal dendrite rapidly grows from the cathode along the surface of the fast ion conductor towards the anode.

The growth rate of the dendrite is a function of the applied voltage and time; the growth of the dendrite may be stopped by removing the voltage or the dendrite may be retracted back towards the cathode, or even disintegrated, by reversing the voltage polarity at the anode and cathode. Changes in the length and width of the dendrite affect the resistance and capacitance of the PMC.

One of the important elements of the PMC is the fast ion conductor, which plays a critical part during the programming of the PMC. The construction of the fast ion conductor is key to providing effective and reliable programming of the PMC and is a significant focus of the present invention.

Thus, the present invention comprises fabrication techniques to form a programmable metallization cell, for use in a programmable conductor random access memory, that will become apparent to those skilled in the art from the following disclosure.

SUMMARY OF THE INVENTION

An exemplary embodiment of the present invention includes a method for forming a programmable cell by forming an opening in a section of a dielectric material to expose a portion of an underlying first conductive electrode forming a recessed chalcogenide-metal ion material in the opening; and forming a second conductive electrode overlying the dielectric material and the chalcogenide-metal material.

A method for forming the recessed chalcogenide-metal ion material comprises forming a metal material being recessed approximately 10–90%, in the opening in the dielectric material, forming a glass material on the metal material and diffusing metal ions from the metal material into the glass material by using ultraviolet light or ultraviolet light in combination with a heat treatment, to cause a resultant metal ion concentration in the glass material.

DETAILED DESCRIPTION OF THE INVENTION

An exemplary implementation of the present invention is directed to a process for forming a programmable metallization cell (PMC) for a PCRAM device as depicted in FIGS. 1–6.

The following exemplary implementation is in reference to the fabrication of programmable conductor random access memory (PCRAM) device. While the concepts of the present invention are conducive to the fabrication of PCRAMs, the concepts taught herein may be applied to other semiconductor devices that would likewise benefit from the use of the process disclosed herein. Therefore, the depiction of the present invention in reference to the manufacture of a PCRAM (the preferred embodiment), is not meant to so limit the extent to which one skilled in the art might apply the concepts taught hereinafter.

Figure 1:
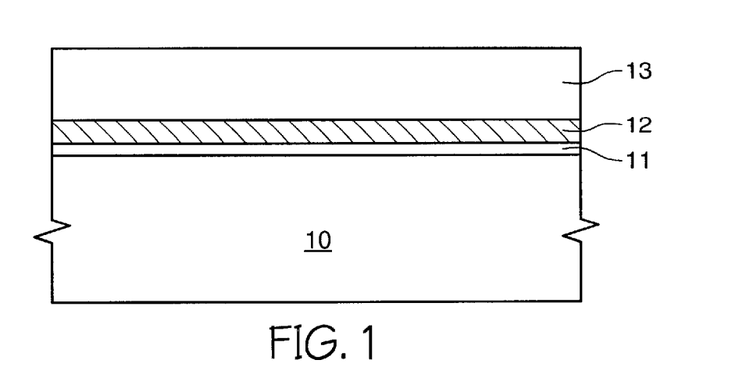
FIG. 1 is a cross-sectional view depicting a semiconductor substrate covered with layers of silicon dioxide, tungsten, which forms the first conductor of the programmable metallization cell, and silicon nitride.

Referring to FIG. 1, a semiconductive substrate 10, such as a silicon wafer, is prepared for the processing steps of the present invention. As described above, a PMC may be implemented in various different technologies. One such application is in memory devices. Insulating material 11, such as silicon dioxide, is formed over substrate 10. Next, conductive material 12, such as tungsten, is formed over insulating material 11. Conductive material 12 will function as one of the conductive electrodes of the PMC. Next, dielectric material 13, such as silicon nitride, is formed over conductive material 12.

Figure 2:
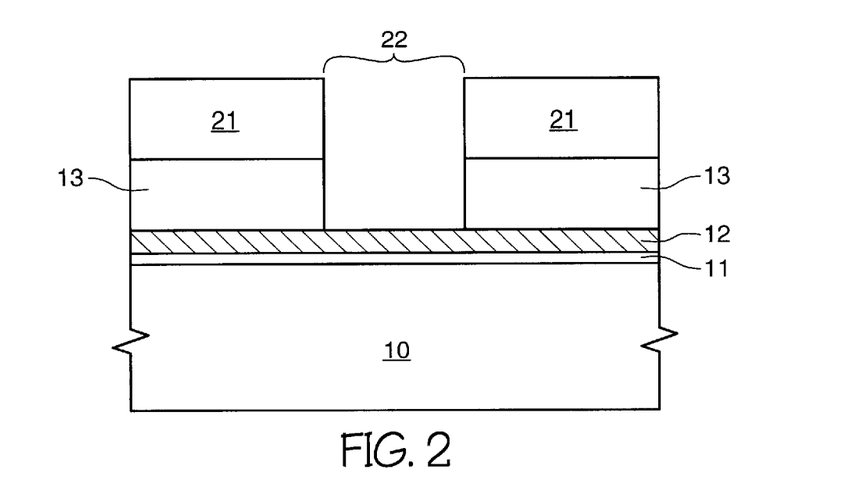
FIG. 2 is a subsequent cross-sectional view taken from FIG. 1 after patterning and etching a via into the silicon nitride to expose the underlying tungsten.

Referring now to FIG. 2, masking material 21 is patterned and then followed by an etch to removed an unmasked portion of dielectric material 13, with the etch stopping once it reaches conductive material 12. The etch results in the formation of via (opening) 22 in preparation for the subsequent formation of a metal ion laced glass material.

Figure 3:
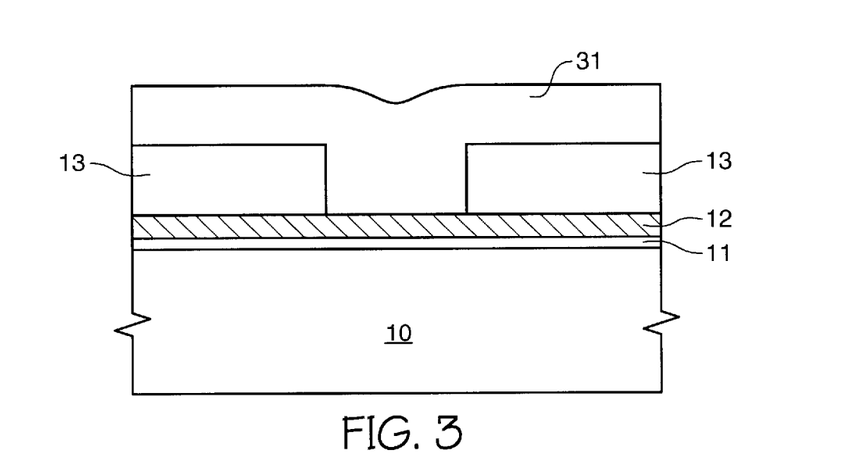
FIG. 3 is a subsequent cross-sectional view taken from FIG. 2 following the formation of a recessed silver plug into the via.

Referring now to FIG. 3, masking material 21 of FIG. 2 is stripped and metal material 31, such as silver, is formed such as to substantially fill via 22. Other metal materials that can be used for metal material 31 include tellurium and copper. Metal material 31 is then planarized down to the surface of dielectric material 13, by using an abrasive planarization etching technique, such as chemical mechanical planarization (CMP).

Figure 4:
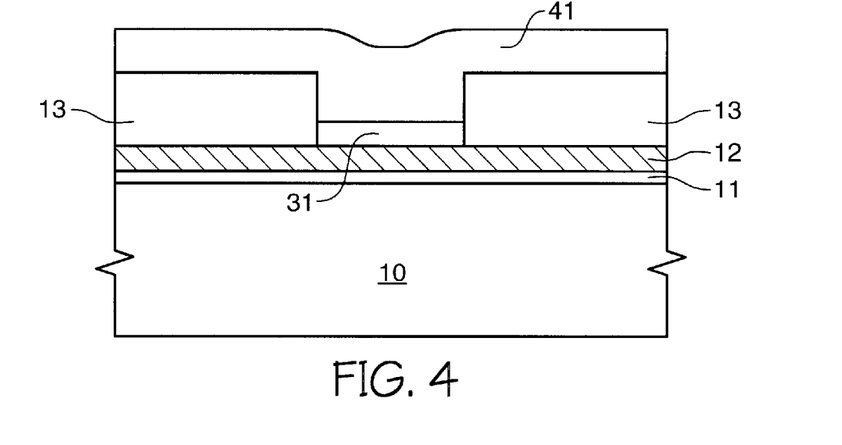
FIG. 4 is a subsequent cross-sectional view taken from FIG. 3 following the formation of a germanium/selenium material that overlies the silicon nitride and the recessed silver plug.

Referring now to FIG. 4, planarized metal material 31 is recessed within via 22, by utilizing a dilute nitric acid etch.

If the preferred metal, silver, is used then an exemplary dilute wet etch having a 50:1 $HNO_3$/Dionized water mixture is a suitable etch to remove the desired amount of silver. Regardless of the type of etch used, it is desirable that metal material 31 is recessed within via 22, the importance of which will become apparent later in the description of the process.

Next, a glass material 41, such as $Ge_{(X)}Se_{(y)}$ (i.e., $Ge_3Se_7$), is formed over dielectric material 13 and recessed metal material 31. A minimum amount of metal material 31 (such as silver) should remain in via 22 to provide an ample metal source for the subsequent metal ion diffusion into glass material 41. Material 31 thickness should be around 10–20% of the total depth of via 22.

For example, if via 22 is approximately 1000 Angstroms deep, then a minimum of 100–200 Angstroms of metal material 31 is required. However, if the required minimum amount of metal material 31 is not maintained, a glass material partially doped with metal (i.e., such as silver) could be used as refill material for glass material 41. In this case, metal material 31 could be recessed in via 22 by 10–90%.

It is important the cell be recessed to ensure that a sufficient amount of metal material 31 remains in via 22 and the overlying glass material 41 is thin enough so that ultraviolet light irradiation will cause sufficient metal migration from metal material 31 into glass material 41. As mentioned, metal material 31 must be of sufficient thickness as to provide a sufficient source for metal migration, while avoiding being entirely consumed during irradiation.

Figure 5:
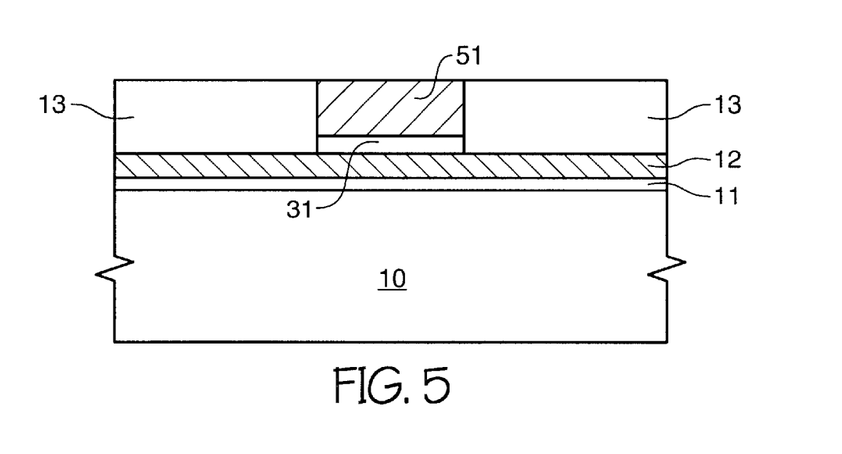
FIG. 5 is a subsequent cross-sectional view taken from FIG. 4 following the planarization of the germanium/selenium material to the level of the surface of the silicon nitride.

Referring now to FIG. 5, the structure is either irradiated with ultraviolet light or thermally treated in combination with irradiation to cause sufficient diffusion of metal ions from recessed metal material 31 into glass material 41 to form metal ion laced glass layer 51, such as $AgGe_3Se_7$. For example, the structure may be irradiated for 15 minutes at 4.5 mw/cm$^2$ with the ultraviolet light at 405 nm wavelength. Additionally, the irradiation may be used in combination with a thermal process using the settings of 110° C. for 5–10 minutes.

The proposed irradiation process is sufficient to cause the desired diffusion of ion metals; however, the disclosed thermal process by itself is not and thus must be used in combination with the irradiation process. It is preferred that the resultant metal ion concentration in the glass material be approximately 27%+/−10%, to ensure the formation of a conductive path/dendrite during the eventual programming of the PMC. Then, metal ion laced glass layer 51 is planarized back to the top surface of dielectric material 13.

Figure 6:
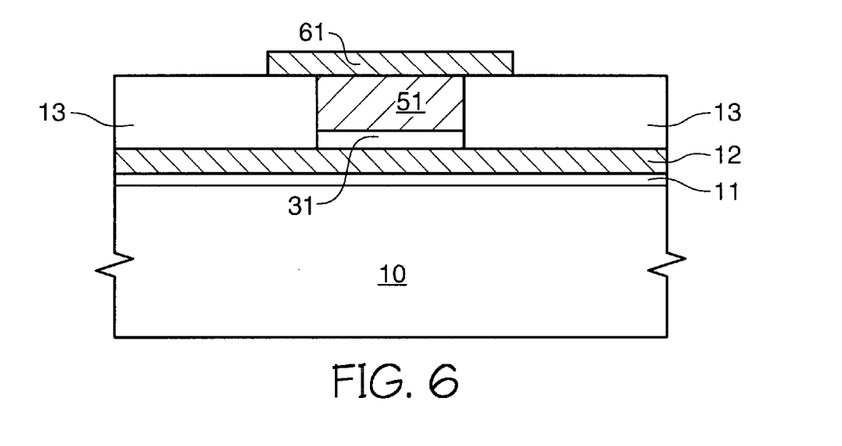
FIG. 6 is a subsequent cross-sectional view taken from FIG. 5 following the formation of a planarized second conductive electrode for the programmable metallization cell.

Referring now to FIG. 6, a second conductive electrode 61 is formed over dielectric material 13 and metal ion laced glass layer 51 to complete the formation of the PMC. Suitable conductive materials that can be used to form electrode 61 include a conductive material that will effectively alloy with the metal material selected to form metal material 31, of which silver is preferred.

In the case where silver is used to form metal material 31, suitable conductive materials for electrode 61 include tungsten, tantalum, titanium, tantalum nitride, tungsten nitride and so forth. The resulting structure forms a fast ion conductor comprising a chalcogenide-metal ion (i.e., such as glass layer 51 containing a concentration of silver ions) and at least two conductive electrodes, namely electrodes 12 and 61. The PCRAM is then completed in accordance with fabrication steps used by those skilled in the art.

The PMC is programmed by applying a sufficient voltage across electrodes 12 and 61 to cause the formation of a conductive path/dendrite (or referred to simply as a dendrite) therebetween, by virtue of a conductor (i.e., such as silver) that is now present in metal ion laced glass layer 51. In general terms, the dendrite can grow at any point on the cell starting with the electrode that is opposite the excess metal. In the specific example of the present invention, with the programming voltage applied across electrodes 12 and 61, the dendrite grows vertically at the surface of fast ion conductive material 51 and along the inside of via 22, with the dendrite extending from electrode 12 towards electrode 61.

It is to be understood that, although the present invention has been described with reference to a preferred embodiment, various modifications, known to those skilled in the art, may be made to the process disclosed herein without departing from the invention as recited in the several claims appended hereto.

What is claimed is:

1. A method of forming a programmable cell comprising the steps of:
   forming an opening in a dielectric material to expose a portion of an underlying first conductive electrode;
   forming a metal material in said opening, wherein said metal material over-fills said opening;
   planarizing said metal material such that a surface of said metal material is substantially level with a surface of said dielectric material;
   removing said planarized metal material such that said metal material is recessed within said opening;
   forming a glass material over said recessed metal material within said opening;
   planarizing said glass material such that a surface of said glass material is substantially level with a surface of said dielectric material;
   diffusing metal ions from said metal material into said glass material; and
   forming a second conductive electrode overlying said dielectric material and said glass material.

2. The method of claim 1, wherein said step of removing said planarized metal material such that it is recessed within said opening comprises removing approximately 50% or less of said metal material that is resident in said opening.

3. The method of claim 1, wherein said step of removing said planarized metal material such that it is recessed within said opening comprises removing approximately 80% to 90% of said metal material that is resident in said opening.

4. The method of claim 1, wherein said step of removing said planarized metal material such that it is recessed within said opening comprises removing greater than approximately 90% of said metal material that is resident in said opening.

5. The method of claim 4, wherein said step forming a glass material on said metal material within said opening comprises forming a metal ion doped glass material within said opening.

6. The method of claim 1, wherein said step of diffusing metal ions comprises irradiating said metal material for approximately 15 minutes at 4.5 mw/cm$^2$ with an ultraviolet light having a 405 nm wavelength.

7. The method of claim 6, further comprising thermal heating at approximately 110° C. for 5–10 minutes during said irradiating.

8. The method of claim 1, wherein said step of diffusing metal ions comprises causing a resultant metal ion concentration in said glass material to be approximately 27%+/−10%.

9. A method of forming a semiconductor assembly having a programmable cell comprising the steps of:
   forming an opening in a dielectric material to expose a portion of an underlying first conductive electrode;
   forming a metal material in said opening, wherein said metal material over-fills said opening;
   planarizing said metal material such that a surface of said metal material is substantially level with a surface of said dielectric material;
   removing said planarized metal material such that it is recessed within said opening;
   forming a glass material over said recessed metal material within said opening;
   planarizing said glass material such that a surface of said glass material is substantially level with a surface of said dielectric material;
   diffusing metal ions from said metal material into said glass material; and
   forming a second conductive electrode overlying said dielectric material and said glass material.

10. The method of claim 9, wherein said step of removing said planarized metal material such that it is recessed within said opening comprises removing approximately 50% or less of said metal material that is resident in said opening.

11. The method of claim 9, wherein said step of removing said planarized metal material such that it is recessed within said opening comprises removing approximately 80% to 90% of said metal material that is resident in said opening.

12. The method of claim 9, wherein said step of removing said planarized metal material such that it is recessed within said opening comprises removing approximately 90% of said metal material that is resident in said opening.

13. The method of claim 12, wherein said step forming a glass material on said metal material within said opening comprises forming a metal ion doped glass material within said opening.

14. The method of claim 9, wherein said step of diffusing metal ions comprises irradiating said metal material for approximately 15 minutes at 4.5 mw/cm$^2$ with an ultraviolet light having a 405 nm wavelength.

15. The method of claim 14, further comprising thermal heating at approximately 110° C. for 5–10 minutes during said irradiating.

16. The method of claim 9, wherein said step of diffusing metal ions comprises causing a resultant metal ion concentration in said glass material to be approximately 27%+/−10%.

17. A method of forming a memory device comprising the steps of:
   forming a first conductive electrode on a substrate surface;
   forming a dielectric material on said first conductive electrode;
   forming an opening in said dielectric material to expose a portion of said first conductive electrode;
   forming a metal material in said opening, wherein said metal material over-fills said opening;
   planarizing said metal material such that a surface of said metal material is substantially level with a surface of said dielectric material;
   removing said planarized metal material such that it is recessed within said opening;
   forming a glass material over said recessed metal material within said opening;
   planarizing said glass material such that a surface of said glass material is substantially level with a surface of said dielectric material;
   diffusing metal ions from said metal material into said glass material; and
   forming a second conductive electrode overlying said dielectric material and said metal material.

18. The method of claim 17, wherein said step of removing said planarized metal material such that it is recessed within said opening comprises removing approximately 50% or less of said metal material that is resident in said opening.

19. The method of claim 17, wherein said step of removing said planarized metal material such that it is recessed within said opening comprises removing approximately 80% to 90% of said metal material that is resident in said opening.

20. The method of claim 17, wherein said step of removing said planarized metal material such that it is recessed within said opening comprises removing greater than approximately 90% of said metal material that is resident in said opening.

21. The method of claim 20, wherein said step forming a glass material on said metal material within said opening comprises forming a metal ion doped glass material within said opening.

22. The method of claim 17, wherein said step of diffusing metal ions comprises irradiating said metal material for approximately 15 minutes at 4.5 mw/cm$^2$ with an ultraviolet light having a 405 nm wavelength.

23. The method of claim 22, further comprising thermal heating at approximately 110° C. for 5–10 minutes during said irradiating.

24. The method of claim 17, wherein said step of diffusing metal ions comprises causing a resultant metal ion concentration in said glass material to be approximately 27%+/−10%.

* * * * *